United States Patent
Lee

(10) Patent No.: US 12,336,349 B2
(45) Date of Patent: Jun. 17, 2025

(54) DISPLAY DEVICE

(71) Applicant: Samsung Display Co., LTD., Yongin-si (KR)

(72) Inventor: Hyeon Bum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 472 days.

(21) Appl. No.: 17/069,339

(22) Filed: Oct. 13, 2020

(65) Prior Publication Data

US 2021/0273145 A1 Sep. 2, 2021

(30) Foreign Application Priority Data

Feb. 28, 2020 (KR) .......................... 10-2020-0025353

(51) Int. Cl.
*H10H 20/857* (2025.01)
*H10H 20/831* (2025.01)
(Continued)

(52) U.S. Cl.
CPC ...... *H10H 20/857* (2025.01); *H10H 20/8312* (2025.01); *H10H 20/853* (2025.01);
(Continued)

(58) Field of Classification Search
CPC ............. H10H 20/857; H10H 20/8312; H10H 20/853; H10H 20/855; H10K 59/122;
(Continued)

(56) References Cited

U.S. PATENT DOCUMENTS

2004/0256620 A1* 12/2004 Yamazaki ......... H01L 29/78669
257/66
2015/0311226 A1* 10/2015 Byun ................. G02F 1/136227
438/27
(Continued)

FOREIGN PATENT DOCUMENTS

CN 105590951 A 5/2016
CN 107818755 A 3/2018
(Continued)

OTHER PUBLICATIONS

Office Action dated Apr. 23, 2025 in corresponding Chinese Patent Application No. 202110049656.2.
(Continued)

*Primary Examiner* — Su C Kim
(74) *Attorney, Agent, or Firm* — KILE PARK REED & HOUTTEMAN PLLC

(57) ABSTRACT

A display device includes a circuit element layer disposed on a substrate; a first insulation layer disposed on the circuit element layer; a first conductor pattern disposed on the first insulation layer; a second insulation layer disposed on the first conductor pattern; a second conductor pattern disposed on the second insulation layer; a third insulation layer disposed on the second conductor pattern; an electrode of a light emitting diode disposed on the third insulation layer; and a pixel defining layer disposed on the third insulation layer and including an opening that overlaps the electrode of the light emitting diode. The opening overlaps the first conductor pattern, and in a plan view, an area of the opening matches an area of the first conductor pattern or is disposed inside the area of the first conductor pattern.

10 Claims, 10 Drawing Sheets

(51) Int. Cl.
    *H10H 20/853* (2025.01)
    *H10H 20/855* (2025.01)
    *H10K 59/122* (2023.01)
    *H10K 59/131* (2023.01)
    *H10K 59/38* (2023.01)
    *H10K 59/40* (2023.01)
(52) U.S. Cl.
    CPC ......... *H10H 20/855* (2025.01); *H10K 59/122* (2023.02); *H10K 59/131* (2023.02); *H10K 59/38* (2023.02); *H10K 59/40* (2023.02)
(58) Field of Classification Search
    CPC ...... H10K 59/131; H10K 59/38; H10K 59/40; H10K 59/123; H10K 59/124; H10K 59/87; H10K 59/8792; H10K 59/1213; H10K 59/1315; H10K 2102/302; A61K 40/4272; G08G 5/21; H10D 30/0295; H10D 84/8316; H10D 84/858
    See application file for complete search history.

(56) References Cited

U.S. PATENT DOCUMENTS

| | | | |
|---|---|---|---|
| 2016/0104757 A1 | 4/2016 | Kim et al. | |
| 2016/0133681 A1* | 5/2016 | Nam | H01L 27/3258 257/40 |
| 2017/0186781 A1* | 6/2017 | Noh | H01L 27/1255 |
| 2017/0338252 A1* | 11/2017 | Lee | H01L 27/1222 |
| 2018/0069068 A1* | 3/2018 | Ka | H01L 31/1129 |
| 2018/0076273 A1 | 3/2018 | Kim et al. | |
| 2019/0271889 A1* | 9/2019 | Zhan | H01L 27/1259 |
| 2019/0393291 A1 | 12/2019 | Jeon et al. | |

FOREIGN PATENT DOCUMENTS

| | | |
|---|---|---|
| CN | 110634914 A | 12/2019 |
| KR | 10-1116825 | 2/2012 |
| KR | 10-2012-0042143 | 5/2012 |
| KR | 10-2015-0020502 | 2/2015 |
| KR | 10-2015-0060296 | 6/2015 |
| KR | 10-2016-0009269 | 1/2016 |
| KR | 10-2016-0092826 | 8/2016 |
| KR | 10-2019-0042132 A | 4/2019 |

OTHER PUBLICATIONS

Key Technology Research and Engineering Application of Global First 500kV Cross-linked Polyethylene Submarine Cable Supervision, Plant Engineering Consultants, 2018.1, pp. 13-18 (in Chinese).

Key Technology Research and Engineering Application of Global First 500kV Cross-linked Polyethylene Submarine Cable Supervision, Plant Engineering Consultants, 2018.1, pp. 13-18 (English Translation).

Wang, "Fabrication of Organic Thin-Film Field-Effect Thansistors which Easy to be Integrated", Chinese Journal of Lasers, vol. 32, No. 9, Sep. 2005, pp. 1262-1265 (in Chinese).

Wang, "Fabrication of Organic Thin-Film Field-Effect Thansistors which Easy to be Integrated", Chinese Journal of Lasers, vol. 32, No. 9, Sep. 2005, pp. 1262-126 (English Translation).

* cited by examiner

DISPLAY DEVICE

CROSS-REFERENCE TO RELATED APPLICATION(S)

This application claims priority to and the benefit of Korean Patent Application No. 10-2020-0025353 under 35 U.S.C. § 119 filed in the Korean Intellectual Property Office on Feb. 28, 2020, the entire contents of which are incorporated herein by reference.

BACKGROUND

1. Technical Field

This disclosure relates to a display device and, more specifically, to a light emitting display device.

2. Description of the Related Art

A display device such as a light emitting diode display device includes a display panel where pixels that display an image are arranged. Each pixel may include a light emitting diode, and transistors and capacitors for light emission of the light emitting diode with predetermined luminance at predetermined timing. Signal lines that apply or transmit signals and/or voltages to the pixels are arranged in the display panel.

The higher the resolution of the display device, the more vivid and live image can be provided. In order to increase the display resolution, more pixels must be arranged in a limited area, and thus a design that can increase the degree of integration of pixels and signal lines, while not interfering with other characteristics of the display device, is required.

SUMMARY

It may be advantageous to reduce a gap between wires of a display device to increase the display resolution. An electrode of a light emitting diode disposed inside a light emission area of a pixel may overlap a conductor pattern such as the wire disposed thereunder. Due to the overlapping conductor pattern, it may be difficult to flatten the surface of an insulation layer between the electrode and the conductor pattern. In case that the insulation layer is not flat, the electrode formed thereon may not be flat, and thus in case that external light is incident, a reflective color band or stripe may be generated and be visually recognized due to the curved (or not flat) electrode. The color band may be more likely to be generated in case that a polarization layer is not used as an anti-reflection layer.

Embodiments of the invention provide a display device that can prevent generation of the color band or may reduce the intensity of the color band in case that the color band is generated, without use of a polarization layer as an anti-reflection layer.

A display device according to an embodiment may include a circuit element layer disposed on a substrate; a first insulation layer disposed on the circuit element layer; a first conductor pattern disposed on the first insulation layer; a second insulation layer disposed on the first conductor pattern; a second conductor pattern disposed on the second insulation layer; a third insulation layer disposed on the second conductor pattern; an electrode of a light emitting diode disposed on the third insulation layer; and a pixel defining layer disposed on the third insulation layer and including an opening that overlaps the electrode of the light emitting diode. The opening overlaps the first conductor pattern, and in a plan view, an area of the opening matches an area of the first conductor pattern or is disposed inside the area of the first conductor pattern.

In a cross-sectional view, a width of the first conductor pattern may be equal to or greater than a width of the opening.

Each of the second insulation layer and the third insulation layer may include an organic insulating material.

The first insulation layer may include an inorganic insulating material.

The electrode of the light emitting diode may be electrically connected with the second conductor pattern through a contact hole of the third insulation layer.

The display device may further include a data line disposed between the first insulation layer and the second insulation layer.

The display device may further include a driving voltage line disposed between the second insulation layer and the third insulation layer.

The display device may further include a light blocking member that does not overlap the opening of the pixel defining layer over the light emitting diode; and a color filter that overlaps the opening of the pixel defining layer over the light emitting diode.

The display device may further include an encapsulation layer disposed between the light emitting diode and the light blocking member.

The circuit element layer may include a plurality of transistors, which may include a transistor including a polycrystalline semiconductor and a transistor including an oxide semiconductor.

A display device according to an embodiment may include a first insulation layer including an inorganic insulating material; a conductor pattern disposed on the first insulation layer; a second insulation layer disposed on the conductor pattern and including an organic insulating material; a linking electrode disposed on the second insulation layer; a third insulation layer disposed on the linking electrode and includes an organic insulating material; a pixel electrode disposed on the third insulation layer and electrically connected with the linking electrode through a contact hole of the third insulation layer; and a pixel defining layer disposed on the third insulation layer and overlapping the pixel electrode. An entirety of the opening overlaps the conductor pattern.

In a cross-sectional view, a width of the conductor pattern may be larger than a width of the opening.

At least two edges of the opening and at least two edges of the conductor pattern may be aligned with each other.

The display device may further include: a data line disposed between the first insulation layer and the second insulation layer; and a driving voltage line disposed between the second insulation layer and the third insulation layer.

The display device may further include: a common electrode disposed on the pixel defining layer; an encapsulation layer disposed on the common electrode; and a light blocking member and a color filter disposed on the encapsulation layer.

The display device may further include a touch sensor layer disposed between the encapsulation layer and the light blocking member.

A display device according to an embodiment may include a circuit element layer disposed on a substrate; a first insulation layer disposed on the circuit element layer; a connecting member disposed on the first insulation layer; a second insulation layer disposed on the connecting member;

a third insulation layer disposed on the second insulation layer; an electrode of a light emitting diode disposed on the third insulation layer; and a pixel defining layer disposed on the third insulation layer and including an opening that overlaps the electrode of the light emitting diode. The electrode of the light emitting diode may be electrically connected with the connecting member through a first contact hole in the third insulation layer and a second contact hole in the second insulation layer. A width of the first contact hole may be larger than a width of the second contact hole in a direction intersecting the second contact hole and the opening.

The first contact hole and the second contact hole may be asymmetric with respect to the connecting member in the direction intersecting the second contact hole and the opening.

The electrode of the light emitting diode may include a first portion that overlaps the opening and a second portion that extends toward the connecting member from the first portion, and the second portion of the electrode may include a portion that contacts a top surface of the second insulation layer.

Each of the second insulation layer and the third insulation layer may include an organic insulating material.

According to the embodiments, the generation of a reflective color band can be prevented or the intensity of the color band can be reduced, thereby preventing color band from being visually recognized. In addition, the embodiments can provide recognizable effects throughout the specification.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
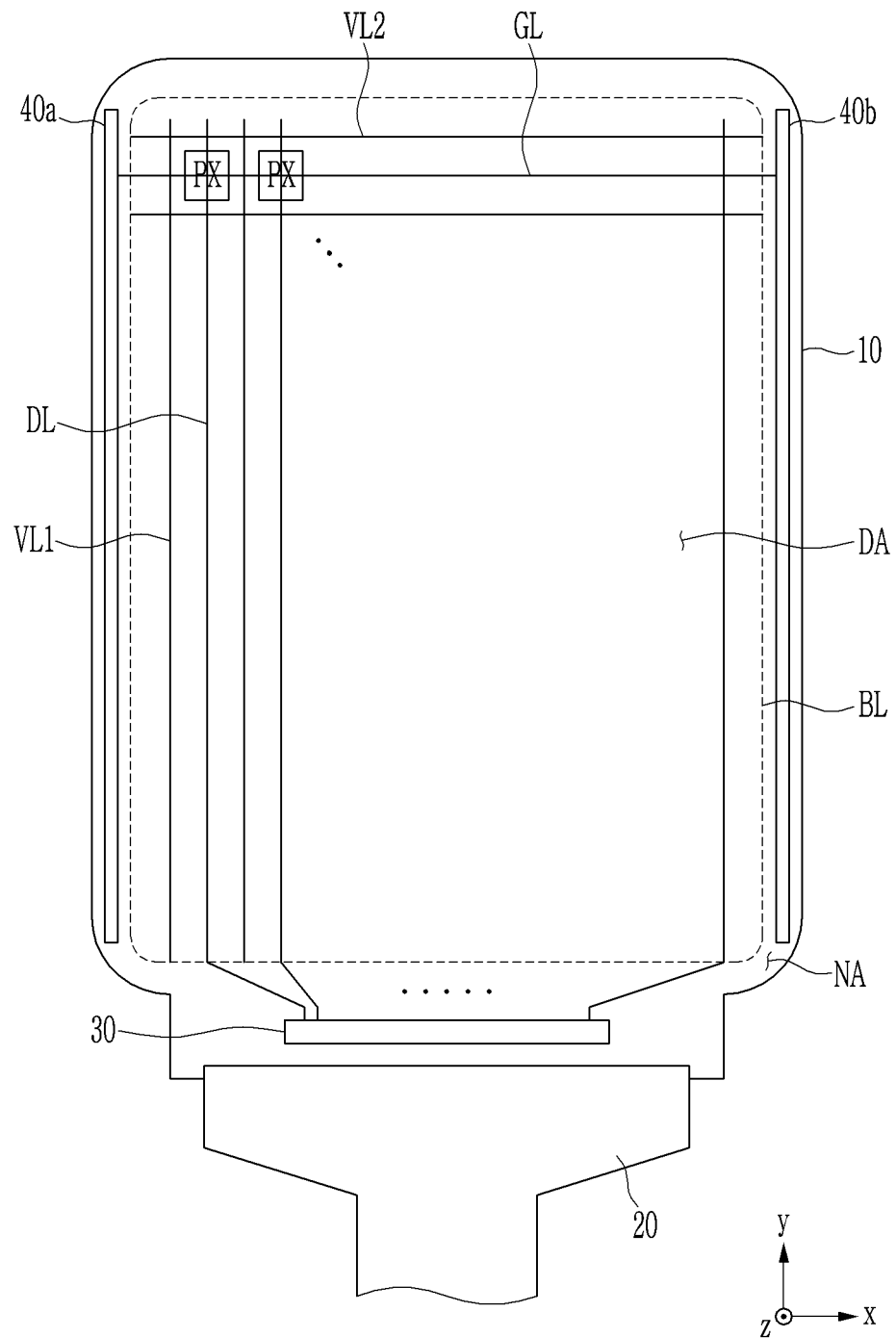
FIG. 1 is a schematic plan view illustrating a display device according to an embodiment.

Embodiments of the invention will be described hereinafter with reference to the accompanying drawings. Although the invention may be modified in various manners and have additional embodiments, embodiments are illustrated in the accompanying drawings and will be described in the specification. However, the scope of the invention is not limited to the embodiments in the accompanying drawings and the specification and should be construed as including all the changes, equivalents and substitutions included in the spirit and scope of the invention.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Further, "over" or "on" may include positioning on or below an object and does not necessarily imply a direction based upon gravity.

The term "overlap" as used herein may include layer, stack, face or facing, extending over, covering or partly covering or any other suitable term as would be appreciated and understood by those of ordinary skill in the art. The term "do not overlap" as used herein may include "apart from" or "set aside from" or "offset from" and any other suitable equivalents as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes," and/or "including" are used in this specification, they or it may specify the presence of stated features, integers, steps, operations, elements and/or components, but does not preclude the presence or addition of other features, integers, steps, operations, elements, components, and/or any combination thereof.

In the drawings, the symbols x, y and z are used to indicate the direction, the symbol x is a first direction, y is a second direction that is perpendicular to the first direction, and z is a third direction that is perpendicular to the first direction and the second direction.

It will be understood that, although the terms "first," "second," "third," or the like may be used herein to describe various elements, these elements should not be limited by these terms. These terms are used to distinguish one element from another element or for the convenience of description and explanation thereof. For example, when "a first hole" is discussed in the description, it may also be termed "a second hole" or "a third hole" in the claims, and "a second hole" and "a third hole" may be termed in a similar manner without departing from the teachings herein.

FIG. 1 is a schematic plan view illustrating a display device according to an embodiment.

Referring to FIG. 1, a display device includes a display panel 10. The display panel 10 includes a display area DA where an image is displayed, and a non-display area NA disposed at the periphery of the display area DA and where elements and/or signal lines for generating and/or transmitting various signals applied to the display area DA are arranged. The display area DA may be inside the boundary line BL in a dotted line, whereas the non-display area NA may be outside the boundary line BL. The display area DA may correspond to a screen.

A plurality of pixels PX may be arranged in a matrix format in the display area DA of the display panel 10. Signal lines such as data lines DL, gate lines GL, and the like may also be disposed inside the display area DA. The gate lines GL may extend approximately in a first direction x (e.g., a row direction), and the data lines DL may extend approximately in a second direction y (e.g., a column direction). Each pixel PX is electrically connected to a gate line GL and a data line DL, and thus may receive a gate signal (also referred to as a scan signal) and a data voltage (also referred to as a data signal) from the gate line GL and the data line DL. Driving voltage lines VL1 that transmit a driving voltage to a pixel PX and initialization voltage lines VL2 that transmit an initialization voltage to a pixel PX may be arranged in the display area DA. The driving voltage line VL1 may extend approximately in the second direction y. The initialization voltage line VL2 may extend approximately in the first direction x.

The display panel 10 may include a touch sensor layer where touch electrodes for sensing contact or non-contact touch of a user are arranged. The touch electrodes may be mainly disposed inside the display area DA.

A pad portion may be disposed inside the non-display area NA of the display panel 10. The pad portion may include pads for receiving signals from outside the display panel 10. The display device may include a flexible printed circuit film 20, one end of which is connected (e.g., bonded) to the pad portion of the display panel 10. The other end of the flexible printed circuit film 20 may be connected to a printed circuit board or the like and thus may receive a signal, such as image data, and power voltages, such as a driving voltage, a common voltage, or the like.

A driving device that generates and/or processes various signals for driving the display panel 10 may be disposed inside the non-display area NA or may be disposed in/on the flexible printed circuit film 20 connected to the pad portion. The driving device may include a data driver applying a data voltage to a data line DL, a gate driver applying a gate signal to a gate line GL, and a signal controller controlling the data driver, the scan driver, or the gate driver.

The gate driver may be integrated with the non-display area NA of the display panel 10 as driving circuits 40a and 40b. The driving circuits 40a and 40b may include a driving circuit 40a disposed at one side of the display area DA and a driving circuit 40b disposed at another side of the display area DA, and may extend in the second direction y. The driving circuits 40a and 40b may be electrically connected to the gate line GL. The driving circuits 40a and 40b may include shift registers including stages that are subordinately connected to each other, and each stage may include transistors and capacitors. Each stage may generate and output a gate signal.

The data driver and the signal controller may be provided as an IC chip 30. The IC chip 30 may be disposed inside the non-display area NA of the display panel 10. The IC chip 30 may be located in the flexible printed circuit film 20. The data driver and the signal controller may be formed as a single chip or separate chips.

Figure 2:
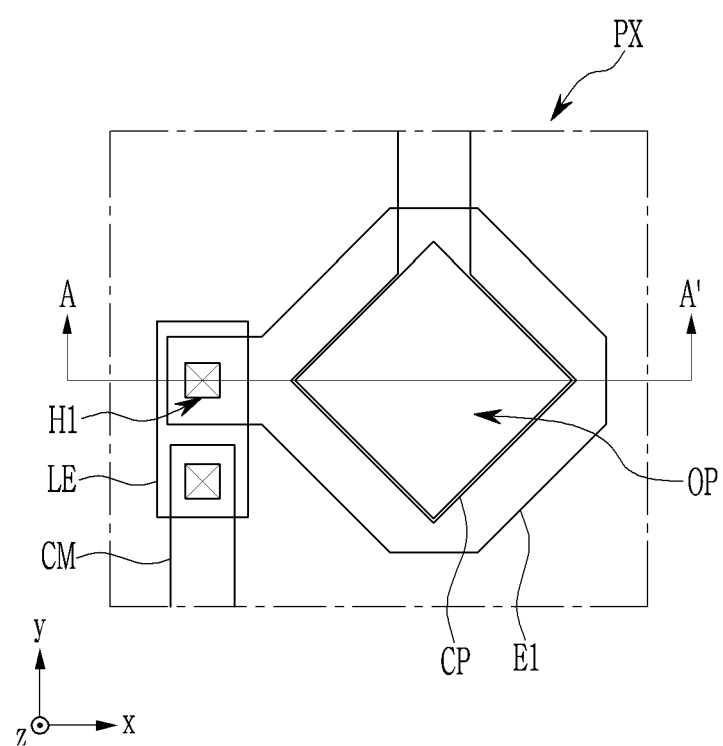
FIG. 2 is a schematic plan view of approximately one pixel area in the display area according to an embodiment.
Figure 3:
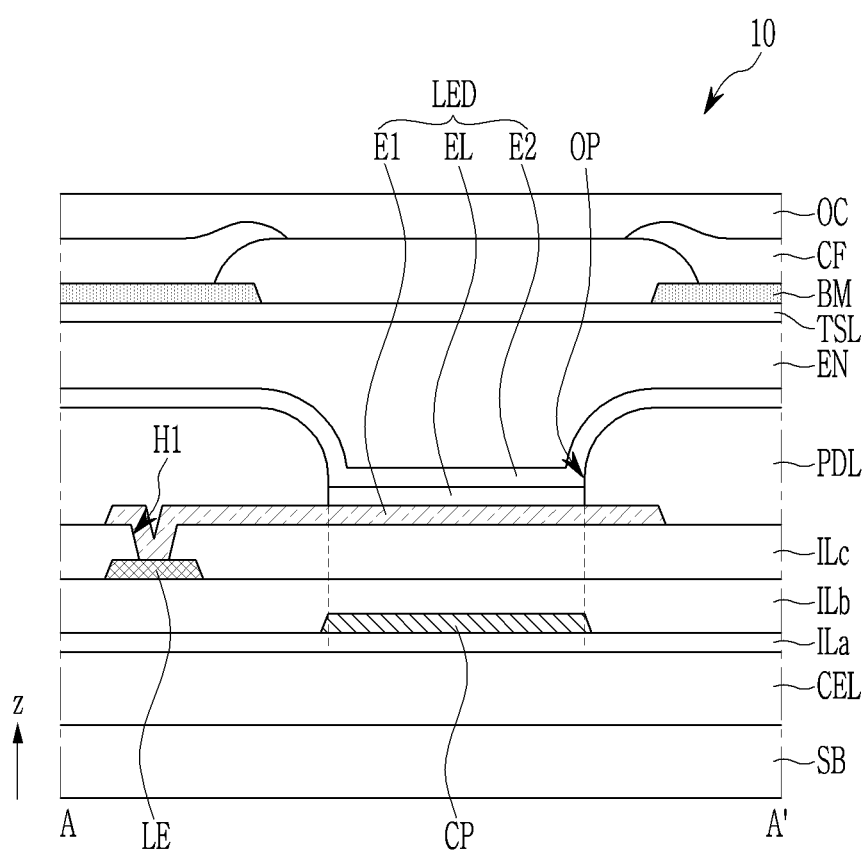
FIG. 3 is a schematic cross-sectional view taken along the line A-A' of FIG. 2.

FIG. 2 is a schematic plan view of approximately one pixel area in the display area according to an embodiment, and FIG. 3 is a schematic cross-sectional view taken along line A-A' of FIG. 2. To provide readily understandable drawings, some elements that may be disposed inside one pixel area are omitted.

Referring to FIG. 2 and FIG. 3, a pixel disposed in the display panel 10 may display one of primary colors. The primary colors may be red, green, and blue. Combinations of red pixels, green pixels, and blue pixels may be arranged in the display panel 10. The display panel 10 may have a structure in which several layers, wires, and elements for forming and driving the pixel PX are stacked.

The substrate SB may be formed of an insulating material such as plastic, glass, and the like. The substrate SB may include one or more barrier layers for preventing permeation of moisture from the outside, and the barrier layer may include an inorganic insulating material such as a silicon oxide (SiOx), a silicon nitride (SiNx), and the like.

A circuit element layer CEL including circuit elements, such as transistors, capacitors, and the like, for driving the pixels PX may be disposed on the substrate SB. Although a single circuit element layer CEL is illustrated, the circuit element layer CEL may include a conductive layer, a semiconductor layer, an insulation layer for forming the transistor, the capacitor, or the like.

A first insulation layer ILa may be disposed on the circuit element layer CEL. The first insulation layer ILa may include an inorganic insulating material such as a silicon nitride (SiNx), a silicon oxide (SiOx), and the like. The first insulation layer ILa may be called an interlayer insulation layer.

A first data conductive layer including a conductor pattern CP and a connecting member CM may be disposed on the first insulation layer ILa. The conductor pattern CP may be a wire that electrically connects circuit elements disposed in the circuit element layer CEL. The conductor pattern CP may be a signal line such as a data line.

A second insulation layer ILb may be disposed on the first data conductive layer. The second insulation layer ILb may be called a first planarization layer.

A second data conductive layer including a conductor pattern such as a linking electrode LE may be disposed on the second insulation layer ILb. The linking electrode LE may be eclectically connected to the connecting member CM through a contact hole of the second insulation layer ILb.

A third insulation layer ILc may be disposed on the second data conductive layer. The third insulation layer ILc may be called a second planarization layer.

The first data conductive layer and the second data conductive layer may include metals such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta). The first data conductive layer and the second data conductive layer may include one or more metal layers.

The second insulation layer ILb and the third insulation layer ILc may include an organic insulating material such as a polyimide, an acryl-based polymer, a siloxane polymer, and the like.

A first electrode E1 of a light emitting diode LED may be disposed on the third insulation layer ILc. The first electrode E1 may be electrically connected to the linking electrode LE through a contact hole H1 of the third insulation layer ILc. The first electrode E1 may include metals such as silver (Ag), nickel (Ni), gold (Au), platinum (Pt), aluminum (Al), copper (Cu), aluminum-neodymium (AlNd), and aluminum-nickel lanthanum (AlNiLa), or a metal alloy. The first electrode E1 may include a transparent conductive material such as indium tin oxide (ITO), indium zinc oxide (IZO), and the like. The first electrode E1 may be called a pixel electrode.

A pixel defining layer PDL including an opening OP that overlaps the first electrode E1 may be disposed on the third insulation layer ILc. The pixel defining layer PDL may include an organic insulating material such as a polyimide, a polyacrylate, a polyamide, and the like. The pixel defining layer PDL may be a black pixel defining layer that may be formed by patterning a black photoresist. The pixel defining layer PDL may include a black dye or pigment, thereby improving a contrast ratio.

The opening OP of the pixel defining layer PDL may define an area corresponding to a light emission area of the pixel PX. For example, the opening OP and the light emission area may be substantially equivalent to each other. Although the opening OP is formed in the shape of a rhombus, the opening OP may have various shapes such as a quadrangle, a polygon, a circle, an oval, and the like.

The entire area of the opening OP may overlap the conductor pattern CP. In a plan view, an area of the opening OP may be substantially equivalent to an area of the conductor pattern CP or may be disposed inside the area of the conductor pattern CP. At least two edges of the opening OP and at least two edges of the conductor pattern CP may be substantially aligned with each other (or, substantially parallel to each other or substantially match each other). A width of the conductor pattern CP corresponding to that of the opening OP may be substantially the same, except for the extension direction of the conductor pattern CP. For such a structure, the conductor pattern CP that overlaps the opening OP may be formed in a shape and an area that correspond to those of the opening OP, respectively. Although a portion of the conductor pattern CP that does not overlap the opening OP extends in the second direction y in FIG. 2, that portion may extend in a different direction than the second direction y or in at least two directions in an embodiment.

In case that only a part of the opening OP overlaps the conductor pattern CP, the second insulation layer ILb and the third insulation layer ILc may not be flat in the opening OP area, which is a light emission area, and accordingly, the first electrode E1 disposed on the third insulation layer ILc may not be flat. In case that the first electrode E1 is not flat, color bands such as green and magenta appear at the edges of the incident region in case that external light enters the display panel 10. The reflective color bands may be problematic in a structure in which external light reflection is prevented by using a light blocking member BM and a color filter CF rather than using a polarization layer as an anti-reflection layer. In the area where the opening OP and the conductor pattern CP overlap, the flatness of the first electrode E1 in the light emission area may be improved by forming and disposing the conductor pattern CP corresponding to the opening OP, thereby preventing the reflective color band from being generated or reducing the intensity of the reflective color band. In addition, leveling areas of the second insulation layer ILb and the third insulation layer ILc for improving the flatness of the light emission area may be reduced, and the second insulation layer ILb and/or the third insulation layer ILc may be formed thinner.

Such a relationship between the opening OP and the conductor pattern CP may be applied regardless of the color of the pixel PX. However, in the case of a green pixel in which a light emission area is formed smaller than a red pixel or a blue pixel, the opening OP and the conductor pattern CP may be designed so as to not overlap.

An emission layer EL of the light emitting diode LED may be disposed on the first electrode E1, and a second electrode E2 of the light emitting diode LED may be disposed on the emission layer EL. The second electrode E2 may also be called a common electrode.

The first electrode E1 may be an anode, which is a hole injection electrode, and the second electrode E2 may be a cathode, which is an electron injection electrode. Holes and electrons are injected into the emission layer EL from the first electrode E1 and the second electrode E2, respectively, and when an exciton, which is a bound injected hole-electron pair, falls from an exited state to a ground state, it can emit light.

An encapsulation layer EN that protects the light emitting diode LED may be disposed on the second electrode E2. The encapsulation layer EN may be a thin film encapsulation layer having a structure in which an organic insulation layer is disposed between inorganic insulation layers.

A touch sensor layer TSL may be disposed on the encapsulation layer EN. A touch electrode of the touch sensor layer TSL may be formed as a mesh structure having an opening that overlaps the opening OP of the pixel defining layer PDL.

The light blocking member BM may be disposed on the touch sensor layer TSL. The light blocking member BM may include a black dye or pigment, and may reduce or prevent light reflection by a metal layer or the like of the display panel 10. The light blocking member BM may be disposed on portions that do not overlap the opening OP, which is the light emission area. The light blocking member BM may also be called a black matrix.

A color filter CF may be disposed on the touch sensor layer TSL. The color filter CF may transmit one of red, green, and blue. The color filter CF displaying different colors may overlap the light blocking member BM. A combination of the color filter CF and the light blocking member BM may serve as an anti-reflection layer. In such a structure, a polarization layer may not be required as an anti-reflection layer, and accordingly, the thickness of the display panel 10 may be reduced. The color filter CF may include quantum dots or phosphors, and may convert the color of light emitted from the light emitting diode LED to red or green. An overcoat layer OC may be disposed on the color filter CF.

Figure 4:
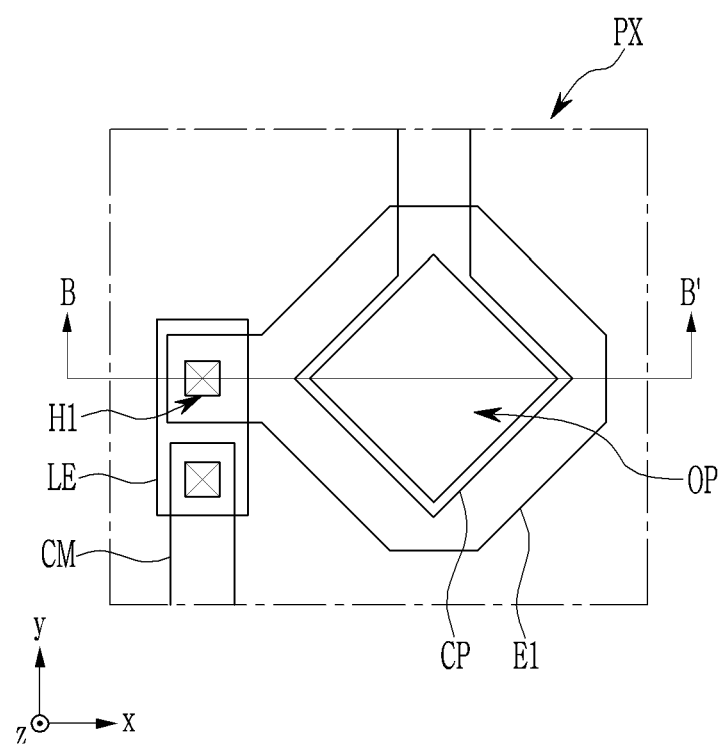
FIG. 4 is a schematic plan view of approximately one pixel area in the display device according to an embodiment.
Figure 5:
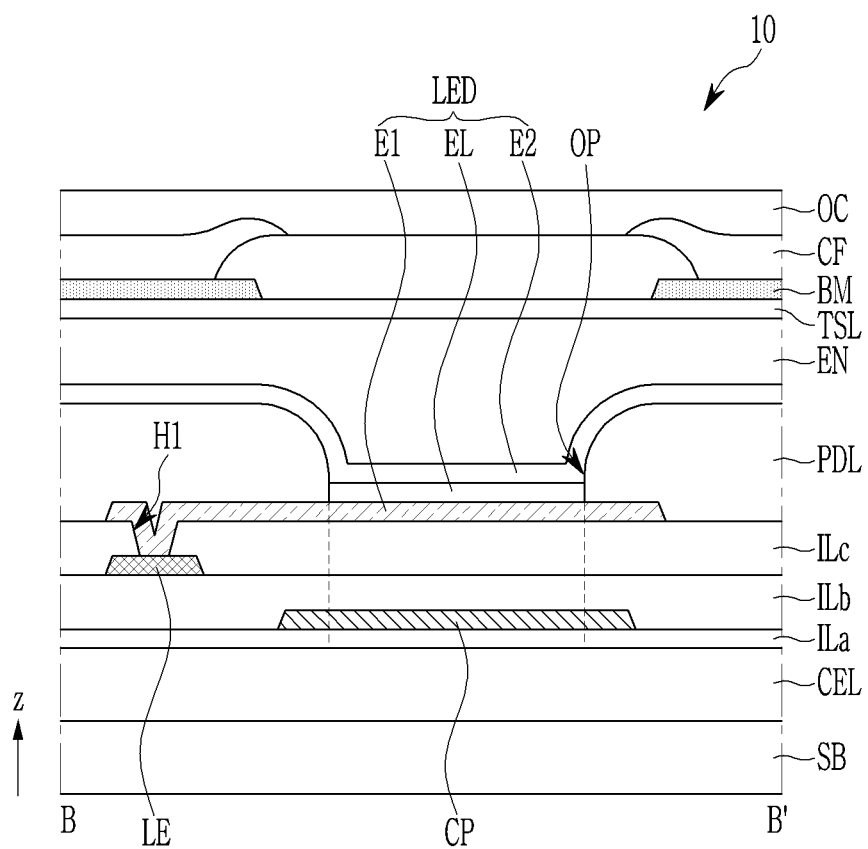
FIG. 5 is a schematic cross-sectional view taken along the line B-B' of FIG. 4.

FIG. 4 is a schematic plan view of approximately one pixel area in the display device according to the embodiment, and FIG. 5 is a schematic cross-sectional view taken along the line B-B' of FIG. 4.

Referring to FIG. 4 and FIG. 5, the entire opening OP may overlap the conductor pattern CP, and in a plan view, the opening OP may be disposed inside the area of the conductor pattern CP. In all directions, a width of the conductor pattern CP may be larger than a width of the corresponding opening OP. For such a structure, the conductor pattern CP overlapping the opening OP may be formed in a shape that corresponds to the opening OP and may have a wider area than the opening OP. In case that the conductor pattern CP does not interfere with other wires between the first insulation layer ILa and the second insulation layer ILb, it may be advantageous to form the conductor pattern CP wider. For example, the flatness of the first electrode E1 may be improved not only in the light emission area but also in the vicinity of the light emission area by the wider conductor pattern CP. Therefore, it may be more effective to prevent generation of the reflective color band. It is also possible to increase the process margin for overlapping with the opening OP.

Figure 6:
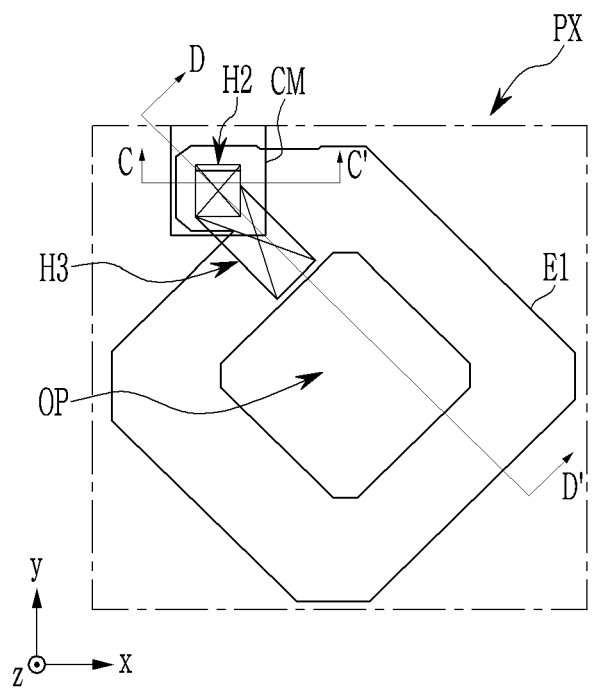
FIG. 6 is a schematic plan view of approximately one pixel area in the display device according to an embodiment.
Figure 7:
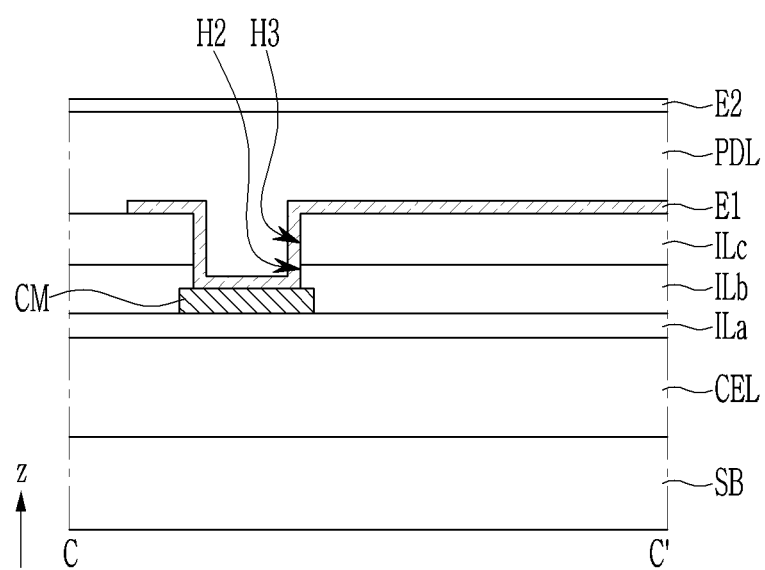
FIG. 7 is a schematic cross-sectional view taken along the line C-C' of FIG. 6.
Figure 8:
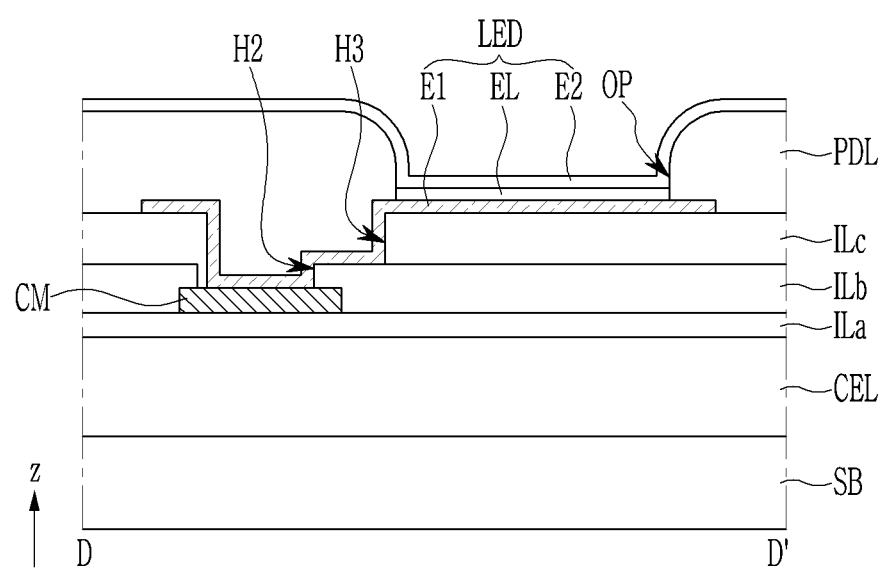
FIG. 8 is a schematic cross-sectional view taken along the line D-D' of FIG. 6.

FIG. 6 is a schematic plan view of approximately one pixel area in the display device according to an embodiment, FIG. 7 is a schematic cross-sectional view taken along the line C-C' of FIG. 6, and FIG. 8 is a schematic cross-sectional view taken along the line D-D' of FIG. 6.

Referring to FIG. 6, FIG. 7, and FIG. 8, the first electrode E1 of the light emitting diode LED may be electrically connected to the connecting member CM through a contact hole H2 of the second insulation layer ILb and a contact hole H3 of the third insulation layer ILc. The connecting member CM may be a first data conductive layer that is disposed between the first insulation layer ILa and the second insulation layer ILb.

In an area overlapping the connecting member CM, the contact hole H2 of the second insulation layer ILb and the contact hole H3 of the third insulation layer ILc may have substantially the same width. The third contact hole H3 of the third insulation layer ILc may be formed broadly toward the opening OP of the pixel defining layer PDL. In a direction intersecting the contact hole H2 of the second insulation layer ILb and the opening OP of the pixel defining layer PDL, the width of the contact hole H3 may be greater than the width of the contact hole H2. In a direction intersecting the contact hole H2 of the second insulation layer ILb and the opening OP of the pixel defining layer PDL, the contact hole H2 of the second insulation layer ILb and the contact hole H3 of the third insulation layer ILc may be asymmetric with respect to the connecting member CM. One edge of the contact hole H3 of the third insulation layer ILc may be adjacent to the opening OP of the pixel defining layer PDL, or may contact or almost contact the opening OP of the pixel defining layer PDL as shown in FIG. 6.

The first electrode E1 that includes a portion disposed in the opening OP, which is the light emission area, includes an extension portion that extends toward the connecting member CM from the light emission area for connection with the connecting member CM. However, in case that the extension portion is disposed on the third insulation layer ILc, the extension portion may be formed to be inclined toward the connecting member CM rather than being parallel to a plane of the substrate SB. This is because the third insulation layer ILc may be inclined (not shown) toward the contact hole H2. Depending on a color of a pixel, a distance between a light emission area and a connecting member CM and/or an inclination of the extension portion of the first electrode E1 of the pixel may vary. For example, an inclination of the extension portion of the first electrode of a pixel may be greater in case that the distance between the light emission area and the connecting member CM of the pixel is greater, and such an inclination may cause generation of a color band having colors such as green and magenta at an edge of an area on which external light is incident.

In an embodiment shown, the portion for the third insulation layer ILc, which may be disposed between the contact hole H2 of the second insulation layer ILb and the opening OP of the pixel defining layer PDL, is removed (i.e., the contact hole H3 of the third insulation layer ILc is formed widely toward the opening OP of the pixel defining layer PDL), such that the extension portion of the first electrode E1 may be formed to be mainly positioned directly on the second insulation layer ILb rather than the third insulation layer ILc. Accordingly, a length of the extension portion E1 may be reduced or an inclination of an inclined portion in the extension portion may be reduced, or the generation of a color band may be prevented or reduced.

Although it is not illustrated, the above-stated encapsulation layer EN, touch sensor layer TSL, light blocking member BM, color filter CF, and overcoat layer OC may all be or selectively be further disposed on the light emitting diode LED.

Figure 9:
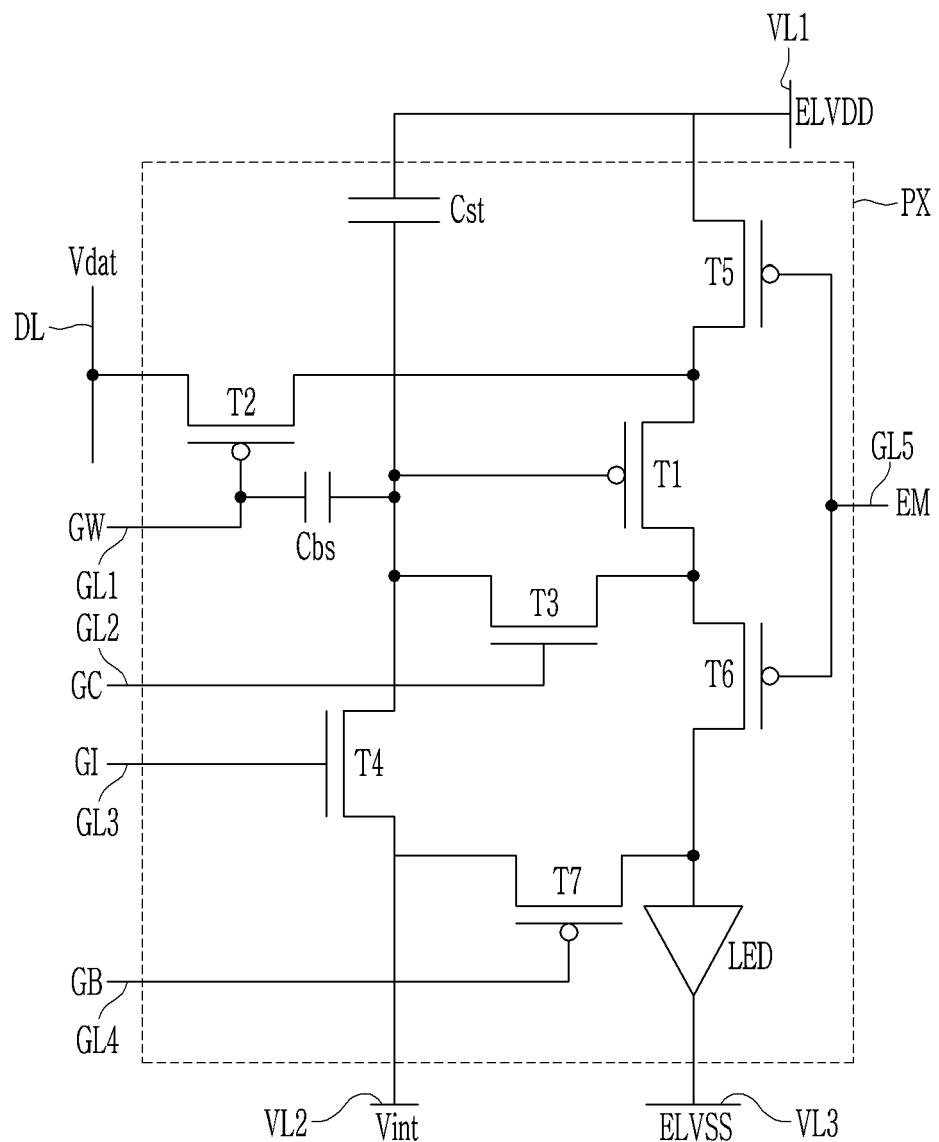
FIG. 9 is an equivalent circuit diagram of a pixel PX of the display device according to an embodiment.

FIG. 9 is an equivalent circuit diagram of a pixel PX of the display device according to an embodiment.

The pixel PX may include transistors T1 to T7 that are electrically connected with signal lines GL1 to GL5, DL, and VL1 to VL3, a storage capacitor Cst, a boost capacitor Cbs, and a light emitting diode LED.

The signal lines GL1 to GL5, DL, and VL1 to VL3 may include gate lines GL1 to GL5, a data line DL, and voltage lines VL1 to VL3. The gate lines GL1 to GL5 may be electrically connected to a gate driver, and the data line DL may be electrically connected to a data driver. The gate lines GL1 to GL5 may include a scan line GL1, an inverted scan line GL2, an initialization control line GL3, a bypass control line GL4, and a light emission control line GL5. The voltage lines VL1 to VL3 may include a driving voltage line VL1, an initialization voltage line VL2, and a common voltage line VL3. The driving voltage line VL1, the initialization voltage line VL2, and the common voltage line VL3 may be respectively connected to a voltage generator.

The second to seventh transistors T2 to T7 may receive gate signals respectively from the gate lines GL1 to GL5.

The scan line GL1 may transmit a scan line GW to the second transistor T2. The inverted scan line GL2 may transmit an inverted scan signal GC to the third transistor T3. The scan signal GW and the inverted scan signal GC may have opposite polarities. For example, in case that a high voltage is applied to the scan line GL1, a low voltage may be applied to the inverted scan line GL2.

The initialization control line GL3 may transmit an initialization control signal GI to the fourth transistor T4. The bypass control line GL4 may transmit a bypass signal GB to the seventh transistor T7. The bypass control line GL4 may be a scan line GL1 that is electrically connected with a pixel PX adjacent in a second direction y. The light emission control line GL5 may transmit a light emission control signal EM to the fifth transistor T5 and the sixth transistor T6.

The data line DL may transmit a data voltage Vdat. The driving voltage line VL1 may transmit a driving voltage ELVDD, the initialization voltage line VL2 may transmit an initialization voltage Vint, and the common voltage line VL3 may transmit a common voltage ELVSS. Luminance of the light emitting diode LED may be adjusted according to the magnitude of the data voltage Vdat applied to the pixel PX. The driving voltage ELVDD, the initialization voltage Vint, and the common voltage ELVSS may each be a DC voltage having a predetermined level.

Regarding the transistors T1 to T7, the first transistor T1, which is a driving transistor, may be a P-type transistor, and may include a polycrystalline semiconductor. The first transistor T1 is a transistor that controls the intensity of a driving current output to an anode of the light emitting diode LED according to the data voltage Vdat applied to the gate electrode of the first transistor T1. The gate electrode of the first transistor T1 is electrically connected with the first electrode of the storage capacitor Cst. A source electrode of the first transistor T1 is electrically connected with a drain electrode of the second transistor T2, and is electrically connected with the driving voltage line VL1 via the fifth transistor T5. A drain electrode of the first transistor T1 is electrically connected with the anode of the light emitting diode LED via the sixth transistor T6.

The second transistor T2, which is a switching transistor, may be a P-type transistor, and may include a polycrystalline semiconductor. A gate electrode of the second transistor T2 is electrically connected with the scan line GL1, and is electrically connected with a first electrode of the boost capacitor Cbs. A second electrode of the second transistor T2 is electrically connected with a data line DL, and a drain electrode of the second transistor T2 is electrically connected with a source electrode of the first transistor T1. In case that the second transistor T2 is turned on by a gate-on voltage (low voltage) of the scan signal GW transmitted through the scan line GL1, the data voltage Vdat transmitted through the data line DL may be transmitted to the source electrode of the first transistor T1.

The third transistor T3, which is a compensation transistor, may be an N-type transistor and may include an oxide semiconductor. The third transistor T3 may electrically connect the drain electrode and the gate electrode of the first transistor T1. Thus, the data voltage Vdat is changed to a compensation voltage through the first transistor T1, and the compensation voltage may be transmitted to the first electrode of the storage capacitor Cst. A gate electrode of the third transistor T3 is electrically connected with the inverted scan line GL2, and a source electrode of the third transistor T3 is electrically connected with the drain electrode of the first transistor T1. A drain electrode of the third transistor T3 is electrically connected with the first electrode of the storage capacitor Cst, the gate electrode of the first transistor T1, and a second electrode of the boost capacitor Cbs. In case that the third transistor T3 is turned on by a gate-on voltage of the inverted scan signal GC transmitted through the inverted scan line GL2, the third transistor T3 electrically connects the gate electrode and the drain electrode of the first transistor T1. A voltage applied to the gate electrode of the first transistor T1 is stored in the storage capacitor Cst, and the storage capacitor Cst may maintain the voltage of the gate electrode of the first transistor T1 constant for one time frame.

The fourth transistor T4, which is an initialization transistor, may be a P-type transistor and may include a polycrystalline semiconductor. A gate electrode of the fourth transistor T4 is electrically connected with the initialization control line GL3. The fourth transistor T4 may initialize the gate electrode of the first transistor T1 and the first electrode of the storage capacitor Cst with the initialization voltage Vint. The gate electrode of the fourth transistor T4 is electrically connected with the initialization control line GL3, and a source electrode of the fourth transistor T4 is electrically connected with the initialization voltage line VL2. A drain electrode of the fourth transistor T4 is electrically connected with the first electrode of the storage capacitor Cst, the gate electrode of the first transistor T1, and the second electrode of the boost capacitor Cbs. The fourth transistor T4 is turned on by a gate-on voltage (high voltage) of the initialization control signal GI transmitted through the initialization control line GL3, and thus may transmit the initialization voltage Vint to the gate electrode of the first transistor T1 and the first electrode of the storage capacitor Cst.

The fifth transistor T5, which is an operation control transistor, may be a P-type transistor and may include a polycrystalline semiconductor. The fifth transistor T5 may transmit the driving voltage ELVDD to the first transistor T1. A gate electrode of the fifth transistor T5 is electrically connected with the light emission control line GL5, a source electrode of the fifth transistor T5 is electrically connected with the driving voltage line VL1, and a drain electrode of the fifth transistor T5 is electrically connected with the source electrode of the first transistor T1. The sixth transistor T6, which is a light emission control transistor, may be a P-type transistor and may include a polycrystalline semiconductor. The sixth transistor T6 may transmit a driving current output from the first transistor T1 to the light emitting diode LED. A gate electrode of the sixth transistor T6 is electrically connected with the light emission control line GL5, a source electrode of the sixth transistor T6 is electrically connected with the drain electrode of the first transistor T1, and a drain electrode of the sixth transistor T6 is electrically connected with the anode of the light emitting diode LED.

The seventh transistor T7, which is a bypass transistor, may be a P-type transistor and may include a polycrystalline semiconductor. The seventh transistor T7 may initialize the anode of the light emitting diode LED. A gate electrode of the seventh transistor T7 is electrically connected with the bypass control line GL4, a source electrode of the seventh transistor T7 is electrically connected with the anode of the light emitting diode LED, and a drain electrode of the seventh transistor T7 is electrically connected with the initialization voltage line VL2. In case that the seventh transistor T7 is turned on by a gate-on voltage (low voltage) of the bypass signal GB, the initialization voltage Vint may be applied to the anode of the light emitting diode LED.

The second electrode of the storage capacitor Cst is electrically connected with the driving voltage line VL1. The cathode of the light emitting diode LED is electrically connected with the common voltage line VL3 that transmits the common voltage ELVSS.

As described above, the first transistor T1 may include a polycrystalline semiconductor, and the third transistor T3 and the fourth transistor T4 may include an oxide semiconductor. The second transistor T2, the fifth transistor T5, the sixth transistor T6, and the seventh transistor T7 may include polycrystalline semiconductors. Thus, the first transistor T1 may have high electron mobility and reduce leakage currents of the third transistor T3 and the fourth transistor T4. As described above, the third transistor T3 and the fourth transistor T4 include semiconductor materials that are different from that of the first transistor T1 such that more stable performance can be provided and reliability can be improved. At least one of the second transistor T2, the fifth transistor T5, the sixth transistor T6, and the seventh transistor T7 may include an oxide semiconductor.

In case that a high voltage is applied to the scan line GL1, the inverted scan line GL2 may be applied with a low voltage, and in case that a low voltage is applied to the scan line GL1, the inverted scan line GL2 may be applied with a high voltage. Since the inverted scan signal GC applied to the inverted scan line GL2 is a signal that is inverted from the scan signal GW, after the data voltage is inputted, the gate voltage of the first transistor T1 can be lowered. On the contrary, the scan signal GW can increase the gate voltage of the first transistor T1. Thus, in case that a data voltage representing black is inputted, the data voltage may be decreased. Since the boost capacitor Cbs is disposed between the scan line GL1 and the gate electrode of the first transistor T1, a gate voltage of the first transistor T1 can be increased, thereby stably outputting a data voltage that represents black.

In an embodiment, the third transistor T3 and the fourth transistor T4 may also include polycrystalline semiconductors, and may be P-type transistors. In this case, the second transistor T2 and the third transistor T3 may receive the same gate signal, and the pixel PX may not include the boost capacitor Cbs.

In an embodiment, the pixel PX includes the seven transistors T1 to T7, one storage capacitor Cst, and one boost capacitor Cbs, but the number of transistors, the number of capacitors, and a connection relationship therebetween may vary.

Figure 10:
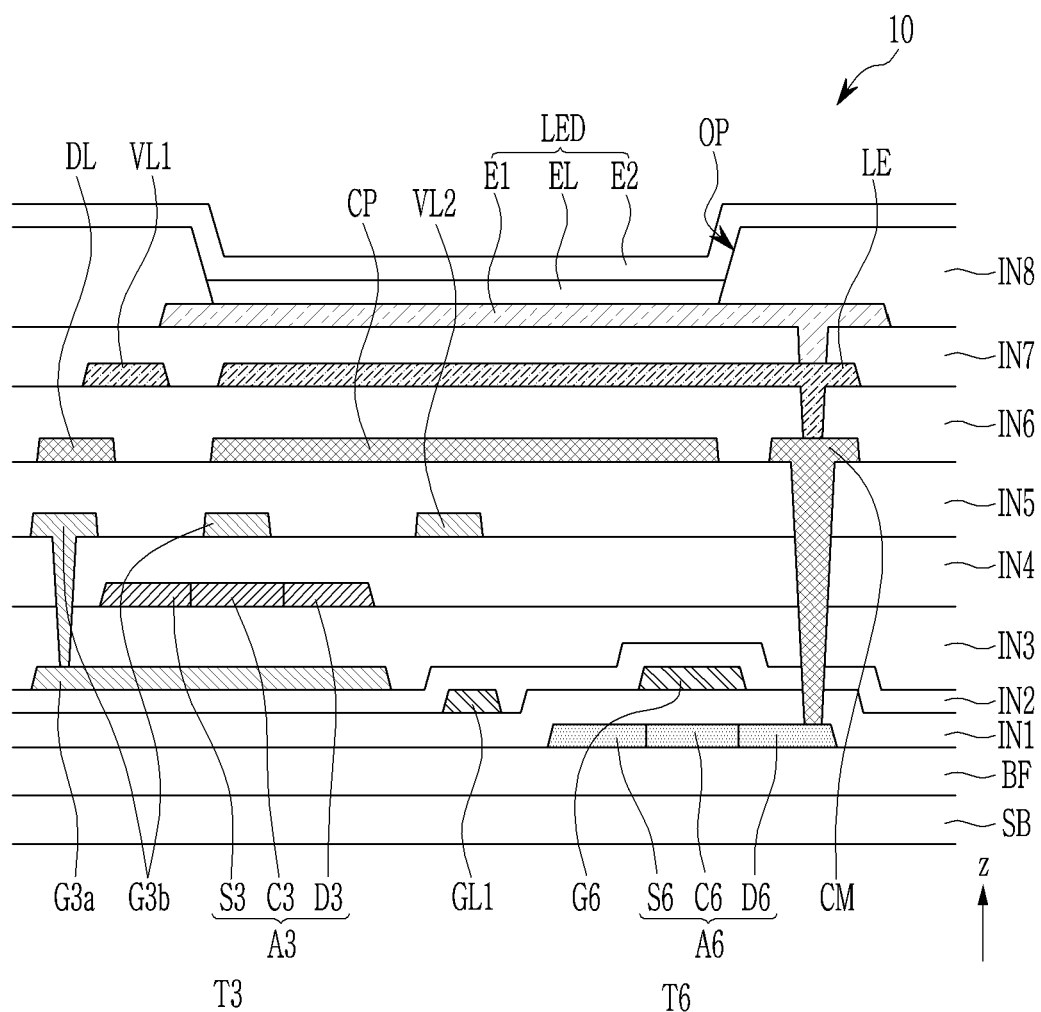
FIG. 10 is a schematic cross-sectional view of the display device according to an embodiment.

FIG. 10 is a schematic cross-sectional view of the display device according to an embodiment. FIG. 10 illustrates a stacked structure of a display panel 10 and a configuration of the circuit element layer CEL in more detail.

Referring to FIG. 10, a buffer layer BF that may include an inorganic insulating material may be disposed on the substrate SB. A semiconductor layer A6 of the sixth transistor T6 may be disposed on the buffer layer BF. The semiconductor layer A6 may include a channel C6, a source electrode S6, and a drain electrode D6. The source electrode S6 and the drain electrode D6 are disposed at opposite sides of the channel C6. The semiconductor layer A6 may include a polycrystalline semiconductor.

An insulation layer IN1 may be disposed on the semiconductor layer A6, and a first gate conductive layer that includes a gate electrode G6 of the sixth transistor T6 and the scan line GL1 may be disposed on the insulation layer IN1. The first, second, fifth, and seventh transistors T1, T2, T5, and T7, which are not illustrated in the drawing, and the sixth transistor T6 may have substantially the same stacking structure.

An insulation layer IN2 may be disposed on the first gate conductive layer, and a second gate conductive layer that includes a lower gate electrode G3a of the third transistor T3 may be disposed on the insulation layer IN2.

An insulation layer IN3 may be disposed on the second gate conductive layer, and a semiconductor layer A3 of the third transistor T3 may be disposed on the insulation layer IN3. The semiconductor layer A3 may include a channel C3, a source electrode S3, and a drain electrode D3. The source electrode S3 and the drain electrode D3 are disposed at opposite sides of the channel C3. The semiconductor layer A3 may include an oxide semiconductor.

An insulation layer IN4 may be disposed on the semiconductor layer A3, and a third gate conductive layer that includes an upper gate electrode G3b of the third transistor T3 and the initialization voltage line VL2 may be disposed on the insulation layer IN4. The upper gate electrode G3b may be electrically connected to the lower gate electrode G3a through contact holes of the insulation layers IN3 and IN4. The third transistor T3 may have a double gate structure including the lower gate electrode G3a, which may be a part of an extension portion of the inverted scan line GL2, and the upper gate electrode G3a electrically connected with the lower gate electrode G3a. The fourth transistor T4, which is not illustrated in FIG. 10, and the third transistor T3 may have substantially the same structure, except that they may not include a configuration corresponding to the lower gate electrode G3a.

An insulation layer IN5 may be disposed on the third gate conductive layer. The insulation layer IN5 may be the above-stated first insulation layer ILa.

A first data conductive layer that includes the data line DL, the conductor pattern CP, and the connecting member CM may be disposed on the insulation layer IN5. The connecting member CM may be electrically connected with the drain electrode D6 through contact holes of the insulation layers IN1 to IN5. The conductor pattern CP may electrically connect the gate electrode of the first transistor T1 with the drain electrode of the third transistor T3 and the drain electrode of the fourth transistor T4.

An insulation layer IN6 may be disposed on the first data conductive layer. A second data conductive layer that includes the linking electrode LE and the driving voltage line VL1 may be disposed on the insulation layer IN6. The insulation layer IN6 may be the above-stated second insulation layer ILb. The linking electrode LE may be electrically connected to the connecting member CM through a contact hole of the insulation layer IN6. The linking electrode LE is formed to overlap a light emission area and thus may serve as a shield electrode that reduces coupling between the first electrode E1 and other signal lines.

An insulation layer IN7 may be disposed on the second data conductive layer, and the first electrode E1 of the light emitting diode LED may be disposed on the insulation layer IN7. The insulation layer IN7 may be the above-stated third insulation layer ILc. The first electrode E1 may be electrically connected with the linking electrode LE through a contact hole of the insulation layer IN7. The elements and layers disposed between the buffer layer BF and the third insulation layer ILc may correspond to the above-stated circuit element layer CEL.

An insulation layer IN8 including an opening OP that overlaps the first electrode E1 may be disposed on the insulation layer IN7. The insulation layer IN8 may be the above-stated pixel defining layer PDL.

The opening OP may wholly overlap the conductor pattern CP. In a plan view, the area of the opening OP may substantially match the area of the conductor pattern CP or may be disposed inside the area of the conductor pattern CP. The conductor pattern CP may substantially correspond to the opening OP or be formed in a larger area. Accordingly, the flatness of the insulation layer IN7 and the first electrode E1 thereon in the light emission area is improved, so that it is possible to prevent or reduce generation of the reflective color band.

The emission layer of the light emitting diode may be disposed on the first electrode E1, and the second electrode E2 of the light emitting diode LED may be disposed on the emission layer EL. The second electrode E2 may be disposed throughout the pixels.

On the light emitting diode LED, all or some of the above-stated encapsulation layer EN, the touch sensor layer TSL, the light blocking member BM, the color filter CF, and the overcoat layer OC may be further disposed.

The position and disposition of the above elements can be changed in various ways depending on the design. For example, the third transistor T3 may have a stacked structure substantially equivalent to the sixth transistor T6, and in this case, the insulation layers IN3 and IN4 may be omitted.

The foregoing is illustrative of example embodiments and is not to be construed as limiting thereof. Although a few example embodiments have been described, those of ordinary skill in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
   a circuit element layer disposed on a substrate;
   a first insulation layer disposed on the circuit element layer;
   a first conductor pattern disposed on the first insulation layer and including one or more metal layers;
   a second insulation layer disposed on the first conductor pattern;
   a second conductor pattern disposed on the second insulation layer;
   a third insulation layer disposed on the second conductor pattern;
   an electrode of a light emitting diode disposed on the third insulation layer; and
   a pixel defining layer disposed on the third insulation layer and including an opening that overlaps the electrode of the light emitting diode, wherein
   the opening overlaps the first conductor pattern,
   in a plan view, an area of the opening matches an area of the first conductor pattern or is disposed inside the area of the first conductor pattern, and
   the first conductor pattern is electrically connected with a drain electrode of a first transistor and a drain electrode of a second transistor to each other, a gate electrode of the first transistor receiving an inverted scan signal, and a gate electrode of the second transistor receiving an initialization control signal.

2. The display device of claim 1, wherein, in a cross-sectional view, a width of the first conductor pattern is equal to or greater than a width of the opening.

3. The display device of claim 1, wherein each of the second insulation layer and the third insulation layer comprise an organic insulating material.

4. The display device of claim 3, wherein the first insulation layer comprises an inorganic insulating material.

5. The display device of claim 1, wherein the electrode of the light emitting diode is electrically connected with the second conductor pattern through a contact hole of the third insulation layer.

6. The display device of claim 1, further comprising:
   a data line disposed between the first insulation layer and the second insulation layer.

7. The display device of claim 1, further comprising:
   a driving voltage line disposed between the second insulation layer and the third insulation layer.

8. The display device of claim 1, further comprising:
   a light blocking member that does not overlap the opening of the pixel defining layer over the light emitting diode; and
   a color filter that overlaps the opening of the pixel defining layer over the light emitting diode.

9. The display device of claim 8, further comprising:
   an encapsulation layer disposed between the light emitting diode and the light blocking member.

10. The display device of claim 1, wherein the circuit element layer comprises a plurality of transistors which include:
    a transistor including a polycrystalline semiconductor; and
    a transistor including an oxide semiconductor.

* * * * *